United States Patent
Wakabayashi

(10) Patent No.: US 10,431,481 B2
(45) Date of Patent: Oct. 1, 2019

(54) LOAD LOCK APPARATUS AND SUBSTRATE PROCESSING SYSTEM

(71) Applicant: TOKYO ELECTRON LIMITED, Tokyo (JP)

(72) Inventor: Shinji Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 420 days.

(21) Appl. No.: 15/216,161

(22) Filed: Jul. 21, 2016

(65) Prior Publication Data

US 2017/0025290 A1    Jan. 26, 2017

(30) Foreign Application Priority Data

Jul. 24, 2015 (JP) ................................ 2015-146912

(51) Int. Cl.
*H01L 21/67* (2006.01)
*H01L 21/677* (2006.01)
*H01L 21/673* (2006.01)

(52) U.S. Cl.
CPC .. *H01L 21/67201* (2013.01); *H01L 21/67373* (2013.01); *H01L 21/67772* (2013.01)

(58) Field of Classification Search
CPC ......... H01L 21/67772; H01L 21/67201; H01L 21/67373
See application file for complete search history.

(56) References Cited

U.S. PATENT DOCUMENTS

| 2002/0185068 A1* | 12/2002 | Gurary | C23C 16/4401 118/722 |
| 2007/0080096 A1* | 4/2007 | Miyajima | H01L 21/67126 206/710 |
| 2010/0111648 A1* | 5/2010 | Tamura | H01L 21/67248 414/217 |

FOREIGN PATENT DOCUMENTS

| JP | 3136345 A | 6/1991 |
| JP | 10-321698 A | 12/1998 |
| JP | 200487781 A | 3/2004 |
| JP | 2009-054859 A | 3/2009 |
| JP | 2010-067940 A | 3/2010 |
| JP | 2014-103298 A | 6/2014 |
| KR | 2001-0084625 A | 9/2001 |

* cited by examiner

*Primary Examiner* — Saul Rodriguez
*Assistant Examiner* — Ashley K Romano
(74) *Attorney, Agent, or Firm* — Nath, Goldberg & Meyer; Jerald L. Meyer

(57) ABSTRACT

A load lock apparatus having a load lock chamber, which is connected to a vacuum transfer chamber configured to transfer a substrate under a vacuum pressure state via a communication hole which is opened and closed by a gate valve, and configured to be capable of switching an inner pressure into an atmospheric pressure state and the vacuum pressure state, is provided. The load lock apparatus includes a load lock chamber main body in which a substrate container having an attachable/detachable cover is carried, wherein the communication hole is formed in a side surface of the load lock chamber; and a cover attaching/detaching mechanism installed at a height position vertically arranged with the communication hole in the load lock chamber; and an elevating mechanism including a mounting table on which the substrate container is loaded and configured to lift and lower the mounting table.

10 Claims, 18 Drawing Sheets

LOAD LOCK APPARATUS AND SUBSTRATE PROCESSING SYSTEM

CROSS-REFERENCE TO RELATED APPLICATION

This application claims the benefit of Japanese Patent Application No. 2015-146912, filed on Jul. 24, 2015, in the Japan Patent Office, the disclosure of which is incorporated herein in its entirety by reference.

TECHNICAL FIELD

The present disclosure relates to a technology of carrying in/out a substrate between a substrate processing system and an outside to process the substrate under a vacuum pressure state.

BACKGROUND

In a semiconductor device-manufacturing process of forming a stacked structure of an integrated circuit on a surface of a semiconductor wafer, which is a substrate, (hereinafter, referred to as wafer), there is a single wafer type vacuum processing in which a single wafer is disposed within a vacuum-exhausted processing module (substrate processing chamber) and then a process gas is then supplied to perform deposition, etching or the like on the wafer. After a plurality of wafers to be processed are transferred to a factory in a state where the wafers are received in a substrate container such as a front open unified pod (FOUP), the wafers are taken out from the substrate container piece by piece and carried into a processing module to perform a predetermined process.

At this time, the inside of the factory to which the FOUP is transferred is in an atmospheric pressure state while the inside of the processing module is usually kept in a vacuum pressure state. Due to this, the transfer of the wafers between the FOUP and the processing chamber is performed via a load lock chamber capable of switching an internal pressure into the atmospheric pressure state and the vacuum pressure state.

However, when the wafers are transferred into the load lock chamber piece by piece and the switching between the atmospheric pressure state and the vacuum pressure state is performed, it is required to install a wafer transfer mechanism between the FOUP and the load lock chamber and between the load lock chamber and the processing module, respectively, resulting in enlargement of the entire configuration of a wafer processing system including the transfer mechanism or the load lock chamber and the processing module.

In this regard, for example, there is known a vacuum processing apparatus in which a wafer transfer mechanism is omitted between a substrate container and a load lock chamber by transferring the entire cassette holding the wafers into the load lock chamber using a bottom opening pod (BOP), which is served as the substrate container and allows a cassette with a plurality of wafers held therein to be taken out from the BOP by removing a cover at the bottom of the BOP.

However, since the FOUP, which has been generally used in a semiconductor factory, does not have a structure enabling a cassette to be taken out and a cover to be removed during carrying-in/out of wafers is installed in a side surface of the FOUP, the aforementioned technology cannot be employed as it is.

Further, there is known a probe apparatus configured to change an orientation of an FOUP between a cover opening/closing mechanism for opening and closing (attaching and detaching) a cover of the FOUP and a delivery hole of the substrates in a probe unit for testing the substrates from the FOUP with the cover removed therefrom by loading the FOUP carried into a housing on a mounting table rotatable about a vertical axis and rotating the mounting table.

However, the housing of the probe apparatus is not a load lock chamber, and it is difficult to achieve an efficient arrangement of the cover opening/closing mechanism and the delivery hole of wafers in consideration of the carrying-in/out of the FOUP between the outside and the load lock chamber, and the like.

SUMMARY

Some embodiments of the present disclosure provide to a load lock apparatus and a substrate processing system having the load lock apparatus, wherein even with a simplified configuration, a cover can be attached to and detached from a substrate container in a load lock chamber and substrates from the substrate container with the cover removed therefrom can be taken out/in.

According to one embodiment of the present disclosure, there is provided a load lock apparatus having a load lock chamber connected to a vacuum transfer chamber configured to transfer a substrate under a vacuum pressure state via a communication hole which is opened and closed by a gate valve, and configured to be capable of switching an inner pressure into an atmospheric pressure state and the vacuum pressure state. The load lock apparatus includes a load lock chamber main body having a carrying-in/out hole through which a substrate container configured to accommodate a plurality of substrates and having an attachable/detachable cover installed on a side surface of the substrate container can be carried in/out, and an opening/closing door configured to open and close the carrying-in/out hole, wherein the communication hole is formed in a side surface of the load lock chamber; a cover attaching/detaching mechanism installed at a height position vertically arranged with the communication hole in the load lock chamber, and configured to be horizontally advanced and retracted between an attachment/detachment position at which the cover is attached/detached to/from the substrate container and a retraction position at which the cover is retracted from the attachment/detachment position; and an elevating mechanism installed in the load lock chamber and including a mounting table on which the substrate container is loaded, the elevating mechanism being configured to lift and lower the mounting table such that the cover-installed side surface of the substrate container loaded on the mounting table can be moved between a height position opposite to the communication hole and a height position opposite to the cover attaching/detaching mechanism.

According to another embodiment of the present disclosure, there is provided a substrate processing system, including: the aforementioned load lock apparatus; a vacuum transfer chamber connected to the load lock chamber through the communication hole and provided with a substrate transfer mechanism configured to transfer the substrate; and a substrate processing chamber connected to the vacuum transfer chamber and configured to perform processing on the substrate transferred by the substrate transfer mechanism.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
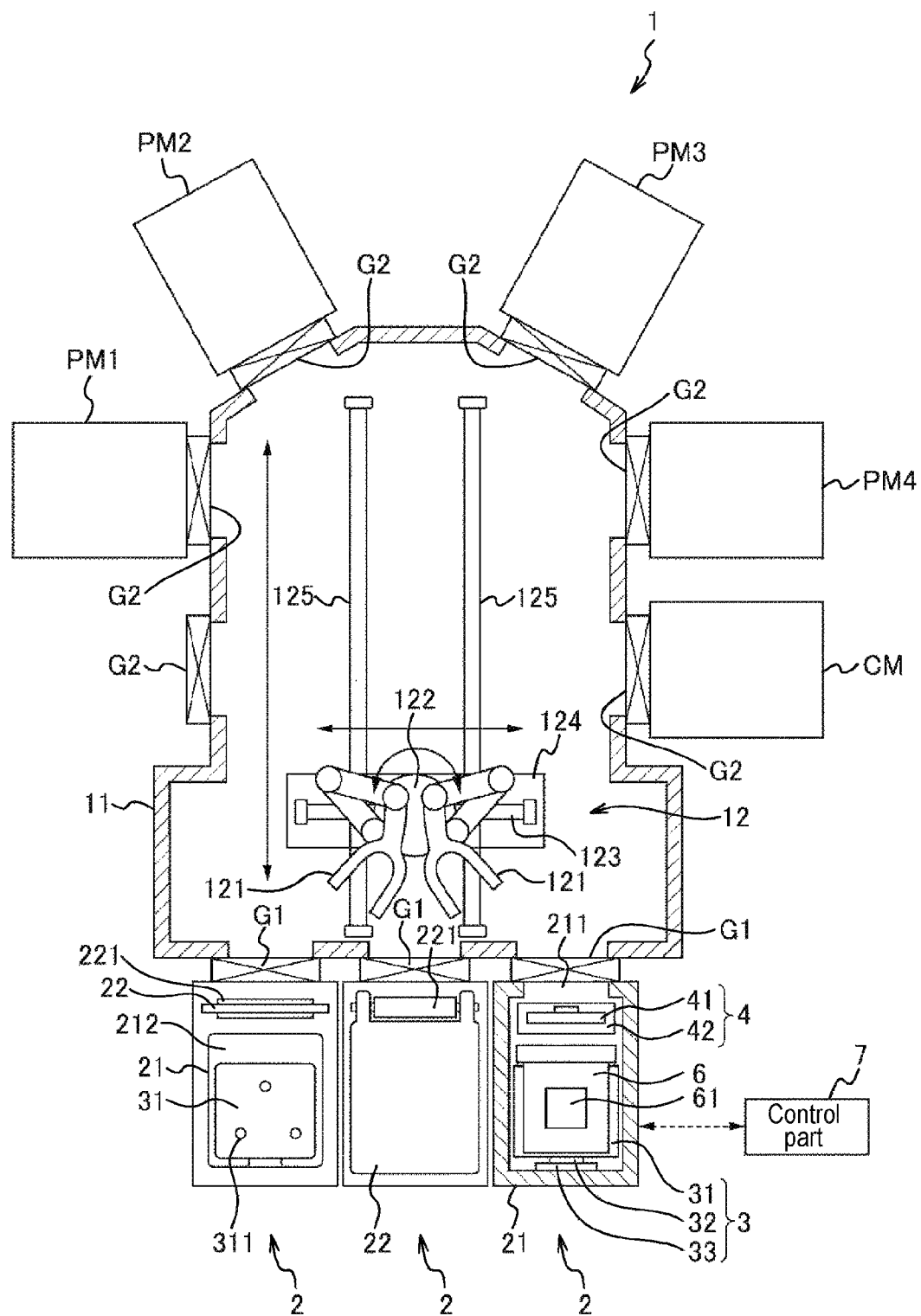
FIG. 1 is a cross sectional plan view illustrating a wafer processing system having a load lock module according an embodiment of the present disclosure.

As one embodiment of the present disclosure, a wafer processing system (substrate processing system) 1 having load lock modules 2, which are load lock apparatuses into and from which a FOUP 6 as a substrate container accommodating a predetermined number of, e.g., 25, wafers W to be processed may be carried in/out, will be described by way of example with reference to FIGS. 1 and 2. As shown in FIG. 1, the wafer processing system 1 has the plurality of load lock modules 2 according to this embodiment, a vacuum transfer module 11 constituting a vacuum transfer chamber where the wafers W are transferred under a vacuum pressure state, and processing modules PM1 to PM4 having processing chambers for performing processing to the wafers W. These modules are arranged in the following order when viewed at a carrying-in/out position of the FOUP 6: the load lock modules 2, the vacuum transfer module 11 and the processing modules PM1 to PM4, wherein neighboring modules are hermetically connected to each other via gate valves G1 and G2.

For example, three load lock modules 2 are horizontally arranged on one sidewall surface of the vacuum carrying module 11. Each of the load lock modules 2 is configured such that the entire FOUP 6 can be carried into the load lock module 2, an atmospheric pressure state and a vacuum pressure state can be then switched to each other, and the wafers W can be then taken out/in to and from the vacuum carrying module 11. The detailed configuration of the load lock module 2 will be described later.

As shown in FIG. 1, the vacuum transfer module 11 is formed in a polygonal shape of a substantially planar shape to thereby have sidewall surfaces to which the plurality of load lock modules 2, the processing modules PM1 to PM4 or the like are connected. The interior of the vacuum transfer module 11 has a vacuum atmosphere. Assuming that the surface in which the above-described three load lock modules 2 are installed is referred to as a front side, the processing modules PM1 to PM4 and a cooling module CM for cooling the wafers W processed in the processing modules PM1 to PM4 are connected to both sidewall surfaces and a rear sidewall surface when viewed from the front side. A wafer transfer mechanism (substrate transfer mechanism) 12 for transferring the wafers W between the load lock modules 2, or between the respective processing modules PM1 to PM4 and the cooling module CM, is installed in the vacuum carrying module 11.

Figure 2:
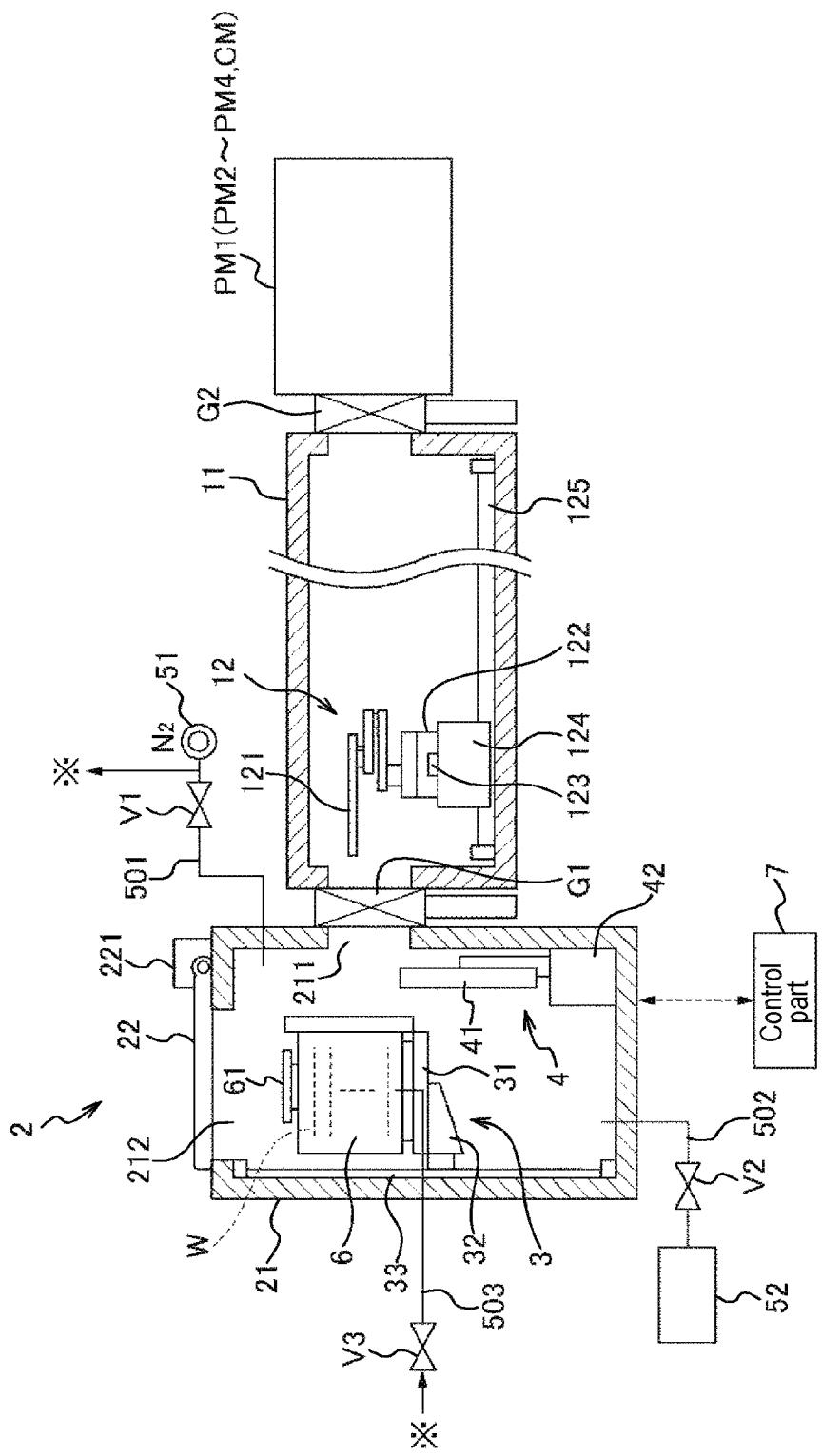
FIG. 2 is a longitudinal sectional side view of the wafer processing system.

As shown in FIGS. 1 and 2, the wafer transfer mechanism 12 has, for example, two extendable transfer arms 121, and these transfer arms 121 are supported by a base body part 122 rotatable about a vertical axis. This base body part 122 is installed on a slider 124 having a horizontal guide rail 123 and can be moved in a right and left direction when viewed from the front side, along the horizontal guide rail 123 by a movement mechanism (not shown). Further, the slider 124 is installed on a forward and backward guide rail 125 disposed on a bottom surface of the vacuum transfer module 11 and can be moved in a forward and backward direction in the vacuum transfer module 11 by another movement mechanism (not shown). This configuration allows the respective transfer arms 121 to enter the three load lock modules 2, the respective processing modules PM1 to PM4 and the cooling module CM, which make it possible to deliver the wafers W among these modules 2, PM1 to PM4 and CM.

Further, the vacuum transfer module 11 is connected to a vacuum exhaust mechanism (not shown) for vacuum-exhausting the inside of the vacuum transfer module 11 to keep the inside of the vacuum transfer module 11 in a vacuum pressure state of a predetermined pressure.

The processing modules PM1 to PM4 are configured to dispose the wafers W in the processing chambers of the vacuum pressure state and supply a process gas to perform a process on the wafers W. The processing includes a film formation process of performing film formation on surfaces of the wafers by using a film forming gas, an annealing process of performing a heating process on the wafers W under an atmosphere of supplying an annealing gas after the film formation process, an etching process of etching thin films formed on the surfaces of the wafers W by using an etching gas, an ashing process of removing unnecessary resist films or the like from the surfaces of the wafers W by using an ashing gas, and the like. A supply mechanism of the process gas, a plasmarization mechanism for improving reactivity of the process gas, a mounting table of the wafers, a heating mechanism for heating the wafers W on the mounting table or the like may be installed in the processing modules PM1 to PM4, as necessary.

The processing modules PM1 to PM4 connected to the vacuum transfer module 11 may perform different kinds of processes with respect to the wafers W or a common kind of process with respect to the wafers W. When different kinds of processes are performed in the processing modules PM1 to PM4, the wafers W taken from the FOUP 6 are transferred into the respective processing modules PM1 to PM4 in a predetermined sequence, so that a plurality of processes may be performed with respect to the wafers W. And then, the wafers with all the required processes performed are returned to the FOUP 6. At this time, a plurality of sets of processing modules PM1 to PM4 may be installed for some or all of the processing according to requirements of processing time and the like.

Further, when a common kind of process is performed in all the processing modules PM1 to PM4, the wafers W taken from the FOUP 6 are transferred into predetermined processing modules PM1 to PM4 and processed in parallel, and then returned to the FOUP 6.

Further, the cooling module CM may be connected to the vacuum transfer module 11. The processing performed in the processing modules PM1 to PM4 may accompany an increase in the temperature of the wafers W. In this case, it is required to return the processed wafer after cooling up to a temperature acceptable in the FOUP 6. Meanwhile, since the pressure in the respective processing modules PM1 to PM4 or the vacuum transfer module 11 are kept at a high vacuum pressure state, there may be a case where the temperature of the wafers W is hardly decreased during a period that the wafers W are transferred into these processing modules PM1 to PM4. In this case, the cooling module CM exclusively performs cooling of the wafers W.

For example, the cooling module CM has a mounting table on which one wafer W is loaded, or a multistage mounting shelf on which the plurality of wafers W is mounted piece by piece. A cooling mechanism for cooling the loaded wafer W is installed at the mounting table or each stage of the mounting shelf. The cooling mechanism may be configured in a manner of cooling the wafer W by installing a flow path for allowing a refrigerant to flow inside the mounting table or each stage of the mounting shelf, or in a manner of cooling the wafer W by using a Peltier element or the like. When it is difficult to quickly cool the wafer W by the cooling mechanism in the same degree of vacuum pressure state as that of the processing modules PM1 to PM4 or the vacuum transfer module 11 described above, the gate valve G2 may be closed and then a pressure-adjusting gas may be supplied into the cooling module CM or a heat transfer gas may be introduced to flow through a gap between the wafer W and the mounting table or the mounting shelf.

In addition to the processing modules PM1 to PM4 and the cooling module CM described above, an alignment chamber (not shown) for performing alignment of a central position or a circumferential orientation of each wafer W before the wafer W taken from the FOUP 6 is carried into the respective processing modules PM1 to PM4 may be connected to the vacuum transfer module 11. When the alignment chamber is connected to the vacuum transfer module 11, the alignment of these positions is performed under a vacuum atmosphere. Further, an alignment mechanism may be installed directly within the vacuum transfer module 11.

Subsequently, a detailed configuration of the load lock module 2 to be connected to the wafer processing system 1 having the aforementioned configuration will be described. As previously described above, the load lock modules 2, for example, three load lock modules, installed on the front surface of the vacuum transfer module 11 have a common configuration. In FIG. 1, the right figure among the three load lock modules 2 represents a cross sectional plan view of the load lock module 2, and central and left figures represent plan views of appearances of the load lock modules 2 when viewed from the top surface.

As shown in FIGS. 1 and 2, each of the load lock modules 2 has a load lock chamber main body 21 of which interior space defines a load lock chamber, an elevating mechanism 3 for moving the FOUP 6 in an up and down direction within the load lock chamber, and a cover attaching/detaching mechanism 4 for attaching and detaching a cover 62 installed in a side surface of the FOUP 6.

The load lock chamber main body 21 is composed of a housing of a rectangular parallelepiped shape having an interior space, which allows the FOUP 6 to be carried therein and to be moved in the up and down direction. A communication hole 211 is formed in a side surface of the load lock chamber main body 21 at a height position where the transfer arm 121 of the wafer transfer mechanism 12 installed in the vacuum transfer module 11 can enter the load lock chamber main body 21 when the transfer arm 121 is extended. The communication hole 211 is connected to an opening of the vacuum transfer module 11 through the gate valve G1, and interior atmospheres of the load lock chamber main body 21 and the vacuum transfer module 11 can be communicated with each other and separated from each other by opening and closing the gate valve G1.

Figure 9:
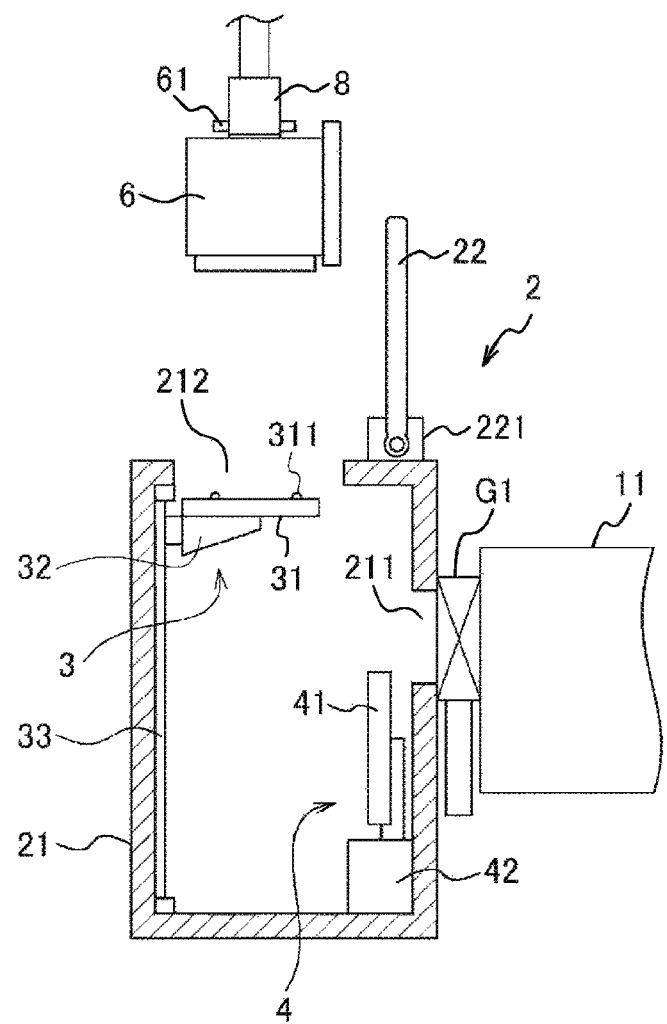
FIG. 9 is an explanatory view of a first operation of the load lock module.

A carrying-in/out hole 212 through which the FOUP 6 is carried in/out is opened in a top surface of the load lock chamber main body 21. A ceiling of a factory where the wafer processing system 1 according to this embodiment is disposed is provided with an overhead hoist transport (OHT) rail (not shown) for transferring the FOUP 6 in an arrangement direction of the three load lock modules 2 shown in FIG. 1. As shown in FIG. 9, the FOUP 6 can be transferred by holding a flange 61 installed at a top surface of the FOUP 6 by a holding part 8 of the OHT (a main body of the OHT is not shown). As a result, the OHT allows the FOUP 6 transferred along the rail to be lowered toward the carrying-in/out hole 212 of the load lock chamber main body 21, and also allows the FOUP 6 received through the carrying-in/out hole 212 to be lifted so that the FOUP 6 may be transferred toward a subsequent transfer position.

Further, an opening/closing door 22 for opening and closing the carrying-in/out hole 212 is installed in the top surface of the load lock chamber main body 21. The opening/closing door 22 is installed at a hinge part 221 fixed to the top surface of the load lock chamber main body 21 and is configured to be pivotable on the hinge part 221 as a central axis by a driving mechanism (not shown) installed in the hinge part 221. When the FOUP 6 is carried in/out, this opening/closing door 22 allows the interior space of the load lock chamber main body 21 to be switched between an opened state (see the left load lock module 2 in FIG. 1)

where the carrying-in/out hole 212 is opened toward the upper OHT and a closed state (see the central load lock module 2 shown in FIG. 1, and FIG. 2) where the carried-in/out hole 212 is closed by the opening/closing door 22, and the load lock chamber main body 21 is isolated from the exterior atmosphere.

The elevating mechanism 3 provided within the load lock chamber main body 21 is installed along an inner wall surface of the load lock chamber main body 21, which is opposite to the communication hole 211 previously described above. The elevating mechanism 3 includes an elevating rail 33 disposed to extend in a vertical direction, an elevating plate 32 movable in a vertical direction along the elevating rail 33, and a mounting table 31 whose bottom surface is supported by the elevating plate 32 and a top surface is configured to load the FOUP 6 thereon.

The top surface of the mounting table 31 is provided with, for example, three position-determining pins 311 inserted and fitted into position-determining holes (not shown) provided in a bottom surface of the FOUP 6 to hold the FOUP 6 such that a surface of the attachable/detachable cover 62 faces the communication hole 211.

The elevating plate 32 can be freely lifted and lowered in a region from a top end to a bottom end of the elevating rail 33. The elevating plate 32 is configured to receive the FOUP 6 on the mounting table 31 through the carrying-in/out hole 212, also to move the mounting table 31 to predetermined height positions including a height position where the FOUP 6 on the mounting table 31 is lifted by the OHT (holding part 8), a height position where the cover 62 is attached and detached by the cover attaching/detaching mechanism 4, and a height position where the wafers W in the FOUP 6 are taken in/out.

As shown in FIG. 2, a purge gas supply line 503 for supplying nitrogen gas as a purge gas into the FOUP 6 is connected to the mounting table 31. A downstream end of the purge gas supply line 503 is connected to a connector part (not shown) installed at the top surface of the mounting table 31. Meanwhile, an upstream end of the purge gas supply line 503 is connected via an opening/closing valve V3 to a nitrogen supply source 51 composed of a nitrogen gas supply line of a factory or the like.

Herein, for example, two openings (not shown) having valves are formed in a bottom surface of a general FOUP 6. These openings serve to allow an atmosphere in the FOUP 6 and the exterior atmosphere to communicate with each other via filters, thereby balancing the pressures inside and outside the FOUP 6.

If the FOUP 6 is loaded on the mounting table 31 according to this embodiment, the connector part of the purge gas supply line 503 described above is connected to one of the two openings so that nitrogen gas as the purge gas is supplied into the FOUP 6 (for the sake of convenience, FIGS. 2, and 11 to 18 show a state where the downstream end of the purge gas supply line 503 is inserted into the FOUP 6). The other of the two openings is connected to an exhaust line (not shown) so that the gas in the FOUP 6 may be exhausted outwards.

The purge gas supply line 503 disposed in the load lock chamber main body 21 or the exhaust line of the FOUP 6 are composed of flexible pipe members or the like so that the purge gas may be supplied into and exhausted from the mounting table 31 at any position on the elevating rail 33. The purge gas supply line 503 corresponds to an inert gas supply part (first inert gas supply part) for supplying an inert gas into the FOUP 6.

Further, the cover attaching/detaching mechanism 4 is disposed at a position aligned with the aforementioned communication hole 211 in the up and down direction, e.g., at a lower side position of the communication hole 211, in the load lock chamber main body 21. The cover attaching/detaching mechanism 4 has an attachment/detachment part 41 for implementing the attachment and detachment of the cover 62 installed at the side surface of the FOUP 6, and a driving part 42 for moving the attachment/detachment part 41 in a horizontal direction in FIG. 2 between an attachment/detachment position at which the attachment and detachment of the cover 62 is implemented and a retraction position at which the cover 62 is retracted from the attachment/detachment position.

Herein, it is difficult to employ a vacuum suction-type cover attaching/detaching mechanism, which is generally used, within the load lock module 2 switched to a vacuum pressure state. Accordingly, the load lock modules 2 according to this embodiment is provided with a mechanism latch-type cover attaching/detaching mechanism 4 for performing the attachment and detachment of the cover 62 using latch keys 411.

Figure 3:
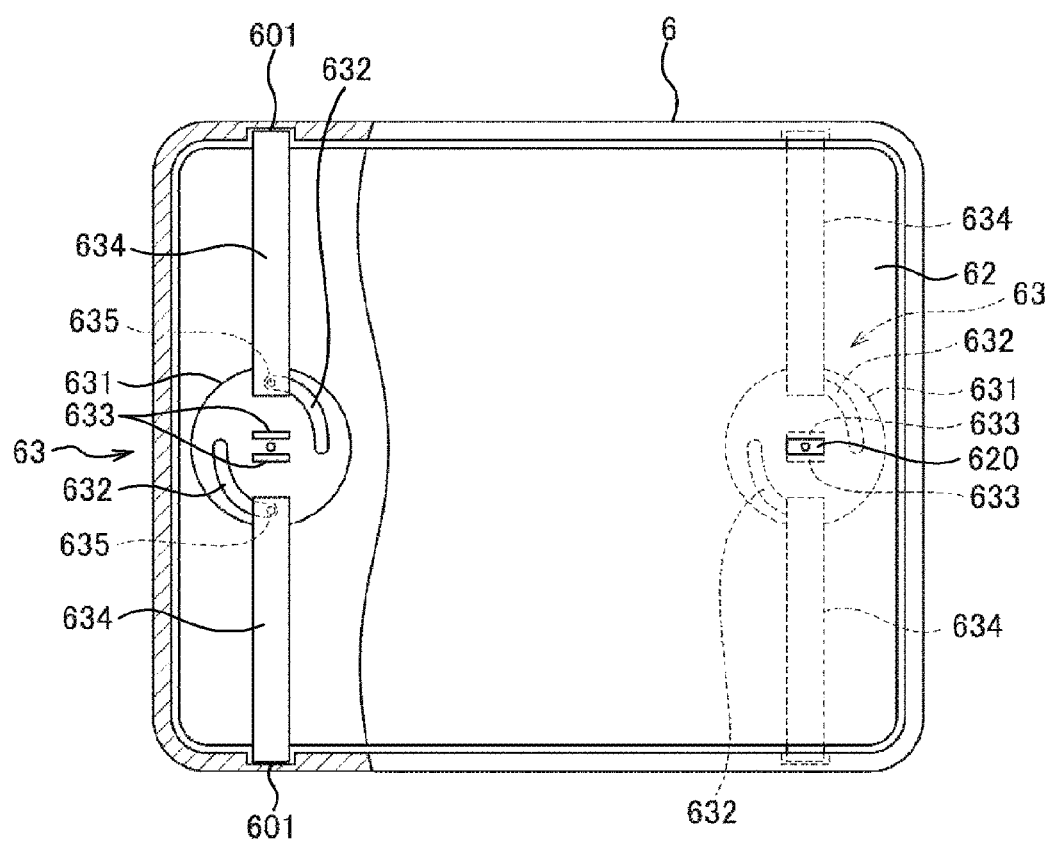
FIG. 3 is a front view of an FOUP to be carried into the load lock module.
Figure 4:
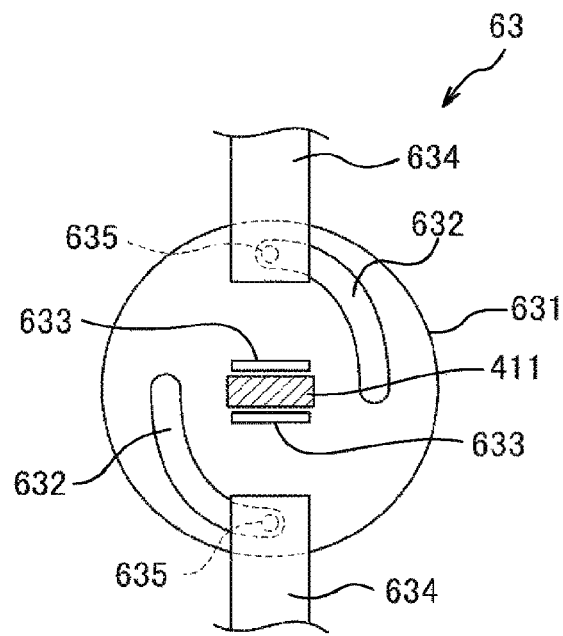
FIG. 4 is a first enlarged view of a fixing mechanism of a cover for the FOUP.
Figure 5:
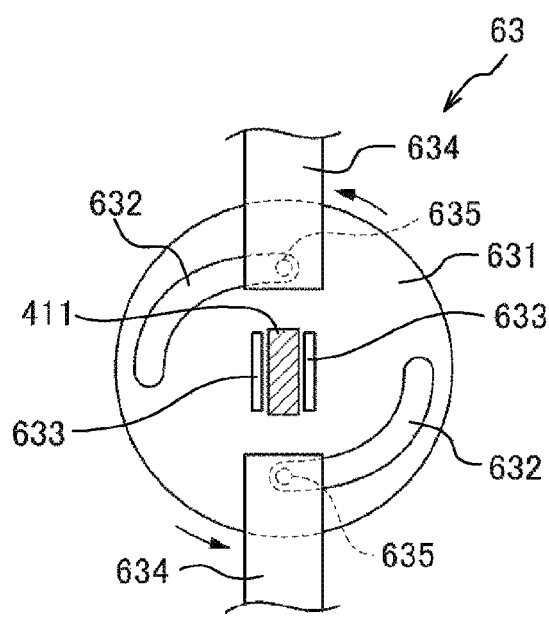
FIG. 5 is a second enlarged view of the fixing mechanism of the cover.

FIG. 3 is a partially broken-away view of the cover 62 and the FOUP 6 when viewed from the front side, and FIGS. 4 and 5 are enlarged views of fixing mechanisms 63 of the cover 62 for the FOUP 6.

The cover 62 is formed of a rectangular plate-shaped member that can be inserted and fitted into an opening formed in a front surface of the FOUP 6. An interior of the cover 62 is formed of a hollow, and the fixing mechanisms 63 for performing switching between a fixed state where the cover 62 are fixed to the FOUP 6 and a fixing-released state is built in the hollow of the cover 62.

When the cover 62 in this embodiment is viewed from the front side as shown in FIG. 3, the fixing mechanisms 63 are installed at two positions on the left and right sides of the cover 62. Each of the fixing mechanisms 63 has a disc plate 631 of the shape of a circular plate shape, which is disposed at a substantially center portion in a height direction of the cover 62 and installed rotatably about the center of the disc plate 631, and lock plates 634 installed to extend upwards and downwards, respectively, from the disc plate 631.

Each of the disc plates 631 is formed with two groove cams 632 in a circumferential direction of the disc plate 631. Each of the groove cams 632 is formed in the shape of a partially cut-off spiral. A distance from the center of the disc plate 631 to the groove cams 632 in a radial direction becomes shortened as going from a position corresponding to one end of the groove cam 632 (a position where a connecting pin 635 described later is inserted in FIG. 4) to a position corresponding to the other end of the groove cam 632 (a position where the connecting pin 635 is inserted in FIG. 5).

The connecting pin 635 is installed at a proximal end (an end at a side of the disc plate 631) of each of the upper and lower lock plates 634, and each of the connecting pins 635 is inserted into its corresponding groove cam 632. The connecting pins 635 are inserted into, for example, opposite grooves (not show) formed in an inner surface of the cover 62 so that they are configured to move in the up and down direction.

A pair of protrusions 633 are formed on a front surface of the disc plate 631. As shown in FIG. 4, the pair of protrusions 633 is directed to a substantially horizontal direction when the cover 62 is fixed by the fixing mechanisms 63. Meanwhile, as shown in FIG. 3, when the cover 62 is viewed from the front, a keyhole 620 into which the latch key 411 of the attachment/detachment part 41 described later is inserted is formed at a position where the protrusion 633 is disposed. The latch key 411 is inserted into the keyhole 620 in an orientation that allows the latch key 411 to be inserted and fitted between these protrusions 633.

Further, as shown in FIG. 3, fitting holes 601 into which respective upper and lower ends of these lock plates 634 can be inserted and fitted are formed in upper and lower inner wall surfaces of the FOUP 6 that are regions where the respective lock plates 634 are disposed.

Figure 6:
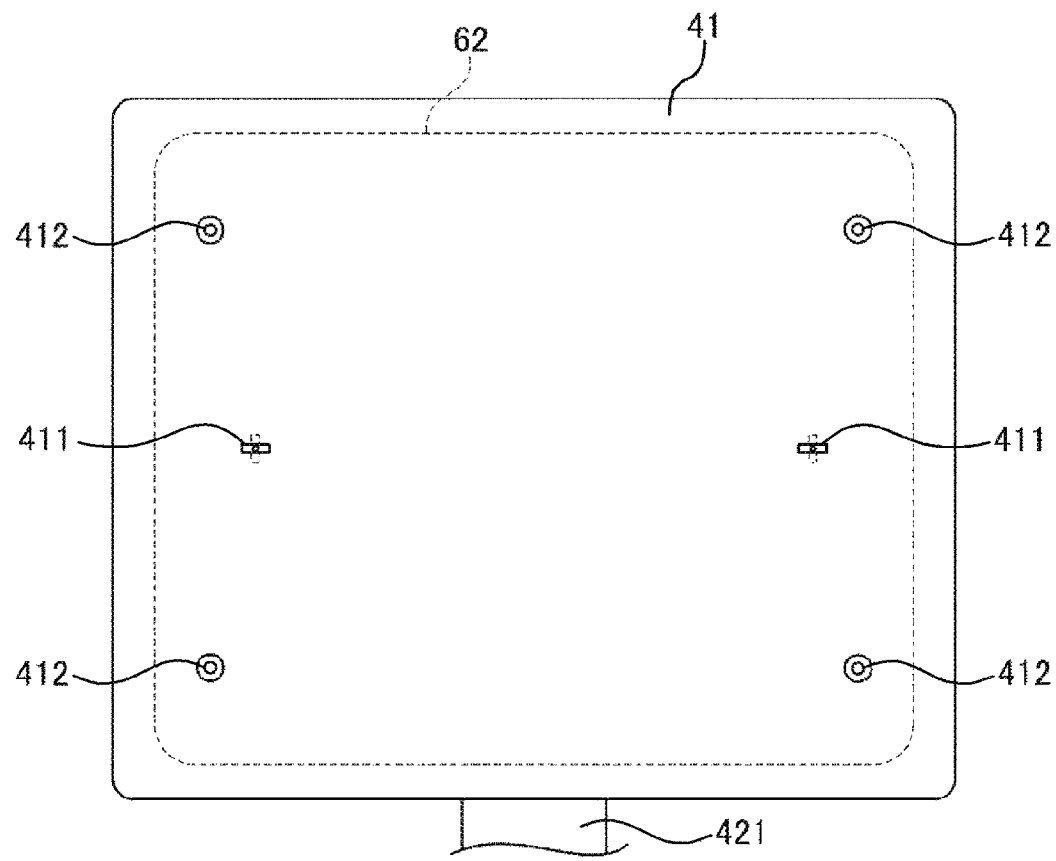
FIG. 6 is a front view of an attaching/detaching part for attaching and detaching the cover to and from the FOUP.

FIG. 6 shows an opposite surface of the attachment/detachment part 41, which constitutes the cover attaching/detaching mechanism 4, to the cover 62. Each latch key 411 having a shape allowing the latch key 411 to be inserted and fitted between the pair of protrusions 633 previously described above is installed on the opposite surface at a position corresponding to the keyhole 620 formed in the cover 62. The latch key 411 is configured to be rotatable by a driving mechanism (not shown) installed in the attachment/detachment part 41 between an orientation indicating that the latch key 411 is inserted and fitted between the protrusions 633 (FIG. 4) and an orientation indicating that the latch key 411 is rotated counterclockwise through 90 degrees at a state where the latch key 411 is fitted between the protrusions 633 (FIG. 5).

Figure 7:
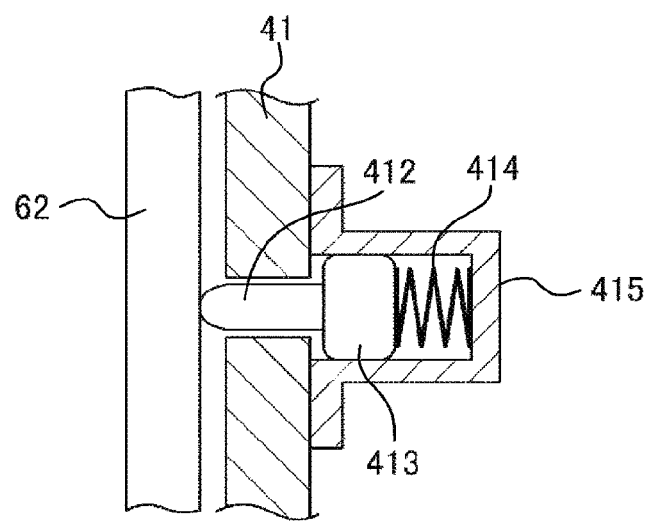
FIG. 7 is a longitudinal sectional side view of a fixing pin installed in the attaching/detaching part.

Further, pressing pins 412 for holding the cover 62 in a stable state are installed in the attachment/detachment part 41 at positions corresponding to four corners of the rectangular cover 62 (shown in a dotted line in FIG. 6). As shown in FIG. 7, each of the pressing pins 412 is installed to penetrate through the plate-shaped attachment/detachment part 41. A guide part 413 is provided at a rear end of the pressing pin 412, and the guide part 413 is inserted into a cover body 415 fixed to a backside of the attachment/detachment part 41. A spring 414 is inserted to be interposed between the guide part 413 and an inner wall surface of the cover body 415, and urges the pressing pin 412 in a direction protruding from the opposite surface of the attachment/detachment part 41.

While the opposite surface points the cover 62, the attachment/detachment part 41 is supported by a supporting part 421 and connected to the driving part 42 via the supporting part 421.

Figure 11:
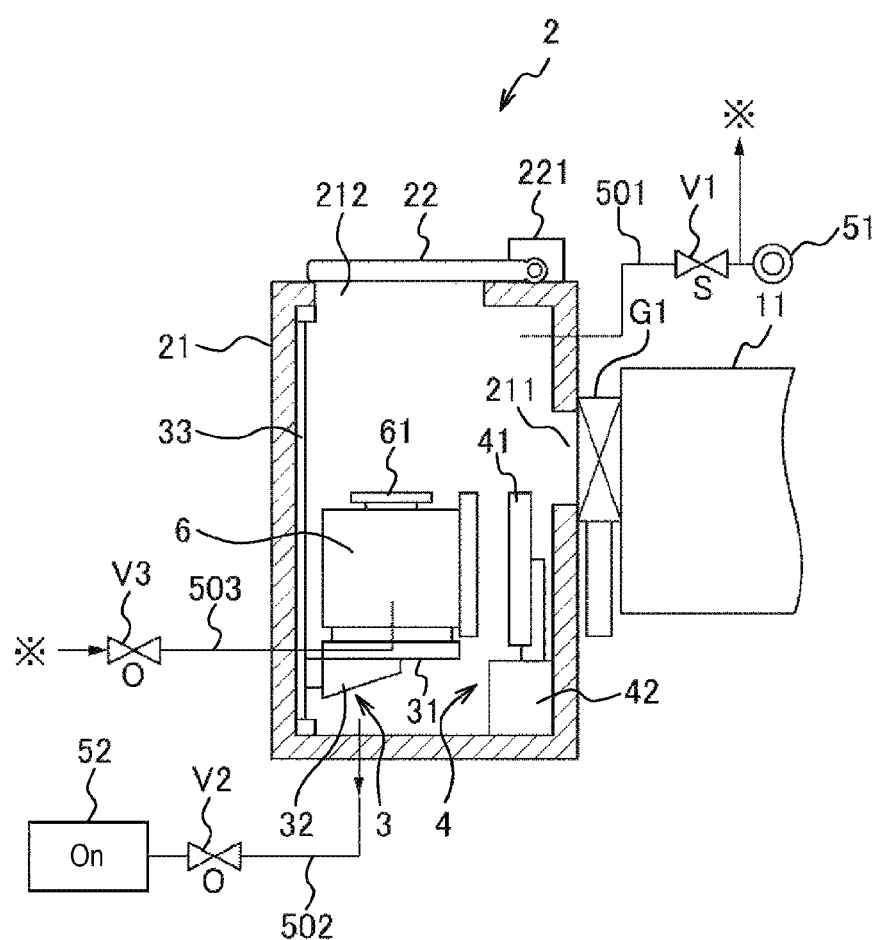
FIG. 11 is an explanatory view of a third operation of the load lock module.

An operation of implementing the attachment and detachment of the cover 62 to and from the FOUP 6 using the attachment/detachment part 41 having the configuration described above will be briefly described. As shown in FIG. 11, if the cover 62 of the FOUP 6 loaded on the mounting table 31 is moved down to a height position facing the attachment/detachment part 41 and the attachment/detachment part 41 is moved toward the FOUP 6 to the attachment/detachment position by the driving part 42, the latch key 411 of the attachment/detachment part 41 is inserted into the keyhole 620 of the cover 62.

The latch key 411 that has entered the inside of the cover 62 via the keyhole 620 is inserted and fitted between the pair of protrusions 633 (FIG. 4). Then, when the latch key 411 is rotated counterclockwise about the central axis thereof by the driving mechanism (not shown) of the attachment/detachment part 41, the disc plate 631 is rotated counterclockwise about the same axis as the latch key 411 via the protrusions 633. As a result, as the connecting pins 635 guided along the groove cams 632 are moved to the inside of the disc plate 631 in a radial direction (FIG. 5), front ends of the upper and lower lock plates 634 are withdrawn from the fitting holes 601 in the FOUP 6. Then, when the attachment/detachment part 41 is retracted to the retraction position, the cover 62 is removed from the FOUP 6.

For the cover 62 held by the attachment/detachment part 41, a force tending to return the cover 62 in a direction spaced away from the opposite surface of the attachment/detachment part 41 is applied to the cover 62 by the pressing pins 412 installed at four corners of the attachment/detachment part 41, while the cover 62 is latched and supported by the latch keys 411 inserted into their corresponding keyholes 620. The forces applied by the pressing pins 412 and the latch keys 411 are balanced with each other, whereby the cover 62 removed from the FOUP 6 is kept in a stable state by the attachment/detachment part 41.

The attachment of the removed cover 62 is performed in a reverse order of the operation described above.

Herein, as shown in FIG. 2, a top end (a top end of the opposite surface that is opposite to the cover 62) of the attachment/detachment part 41 for implementing the attachment and detachment of the cover 62 is set at a lower side of an entrance path of the transfer arm 121 (a transfer path of the wafers W) through which the load lock chamber main body 21 is introduced via the communication hole 211.

Further, as shown in FIG. 2, an exhaust line 502 for vacuum-exhausting the inside of the load lock chamber main body 21 and a nitrogen supply line 501 for supplying nitrogen gas as an inert gas into the load lock chamber main body 21 are connected to the load lock chamber main body 21. A vacuum exhaust part 52 is connected to a downstream end of the exhaust line 502 via an opening/closing valve V2. Further, a nitrogen supply source 51 is connected to an upstream end of the nitrogen supply line 501 via an opening/closing valve V1.

As an integrated circuit formed on a surface of the wafer W has been minimized, an influence of water molecules or oxygen molecules around the wafer W on properties of the circuit has been increased, and a queuing time (Q time), i.e., a maximum standby time that is allowed after certain processing has been performed and until subsequent processing is performed, tends to be shortened. However, as the Q time is excessively shortened, limitation on a processing schedule for the wafer W in the factory increases. Thus, there is a need to suppress the influence of water molecules or oxygen molecules described above. Accordingly, in the load lock modules 2 according to this embodiment, nitrogen gas as the inert gas is supplied into the load lock chamber main body 21, so that the FOUP 6 which accommodates the wafers W completely subjected to the processing by the processing modules PM1 to PM4 may be also filled with nitrogen gas as the inert gas. With this, a concentration of water molecules or oxygen molecules around the wafers W is lowered, thereby suppressing the shortening of the Q time.

The nitrogen supply line 501, the exhaust line 502, the vacuum exhaust part 52 and the like correspond to a pressure switching mechanism for switching the pressure in the load lock modules 2, and the nitrogen supply line 501 corresponds to a second inert gas supply part installed in the pressure switching mechanism. Further, illustrations of the nitrogen supply line 501, the exhaust line 502, the purge gas supply line 503, the nitrogen supply source 51, the vacuum exhaust part 52 and the like are omitted in the figures except for FIGS. 2 and 11 to 18.

Further, as shown in FIGS. 1 and 2, a control part 7 is installed in the wafer processing system 1. The control part 7 includes a computer (not show) having a central processing unit (CPU) and a storage part, and a program composed of a group of steps (instructions) for outputting control signals to execute the respective operations of the load lock modules 2, the vacuum transfer module 11, the processing modules PM1 to PM4 and the cooling module CM has been recorded in the storage part. This program is stored in a storage medium, such as hard disks, compact disks, magnetic optical disks, memory cards and the like, and installed into the storage part therefrom.

Figure 8:
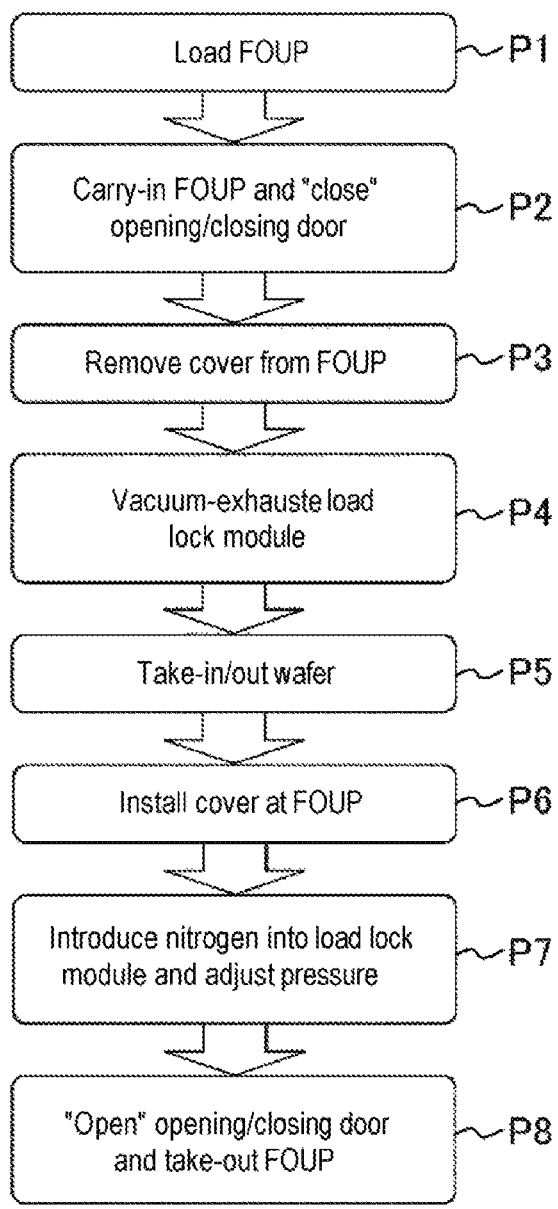
FIG. 8 is a process chart for operations from carrying-in to carrying-out of the FOUP with respect to the load lock module.

The operation of the load lock module 2 having the configuration described above will be described with reference to FIGS. 8 to 18. FIG. 8 is a process chart for the operations from a process of carrying the FOUP 6 into the load lock module 2 to a process of carrying the FOUP 6 after the processing of the wafers W in the FOUP 6.

First, the FOUP 6 accommodating a plurality of wafers W to be processed is transferred by the OHT in a factory and reaches a position above the load lock module 2 in which the FOUP 6 is carried. At this time, the carrying-in/out hole 212 of the load lock module 2 is opened, the elevating mechanism 3 raises the mounting table 31 to a height position near the carrying-in/out hole 212 and is on standby, and the OHT lowers the FOUP 6 toward the mounting table 31 (FIG. 9). At this time, since the gate valve G1 is in a closed state, the load lock module 2 is isolated from the vacuum transfer module 11.

Figure 10:
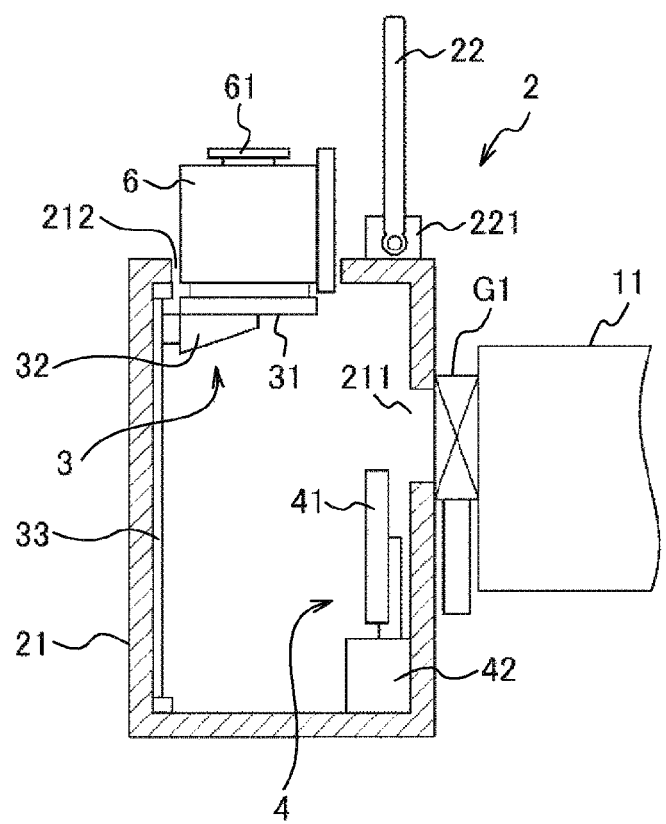
FIG. 10 is an explanatory view of a second operation of the load lock module.

When the FOUP 6 is loaded on the mounting table 31 and held at a predetermined position by the position-determining pins 311, the OHT releases the holding of the flange part 61 by the holding part 8 and withdraws the holding part 8 upwards (P1 in FIG. 8, and FIG. 10). Then, the mounting table 31 is lowered to the height position where the side surface of the FOUP 6 provided with the cover 62 installed therein being located opposite the attachment/detachment part 41 of the cover attaching/detaching mechanism 4, and the FOUP 6 is carried into the load lock module 2 while the carrying-in/out hole 212 is closed by the opening/closing door 22 so that the load lock module 2 moves to a closed state (P2 in FIG. 8, and FIG. 11).

Figure 12:
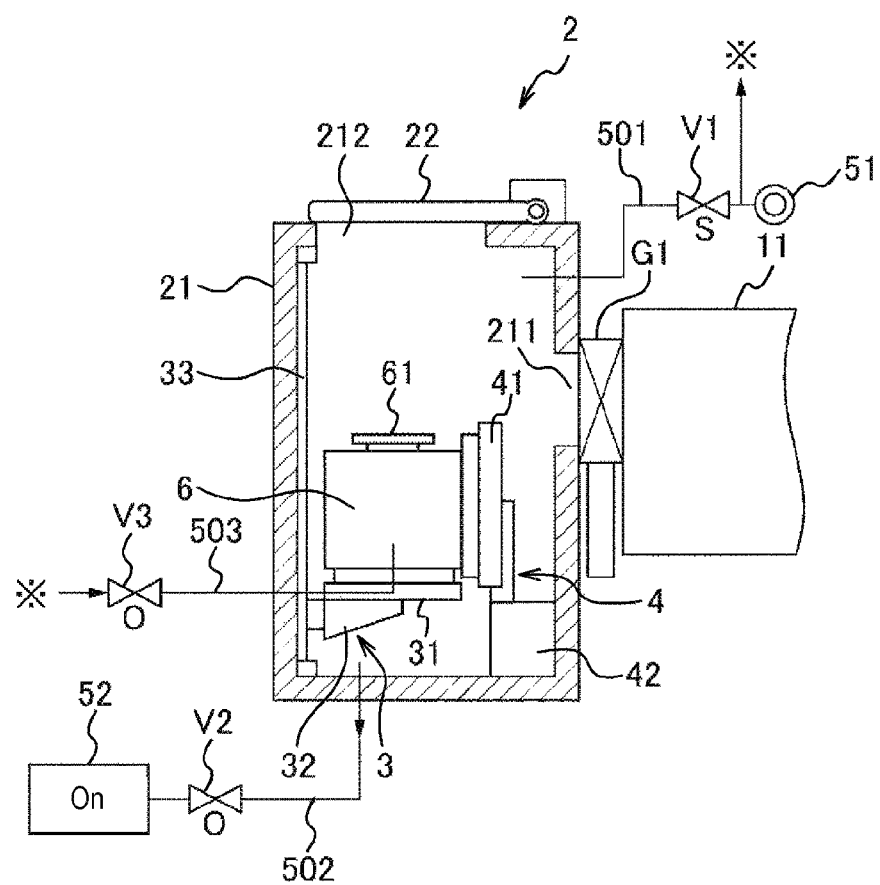
FIG. 12 is an explanatory view of a fourth operation of the load lock module.

Subsequently, the attachment/detachment part 41 is moved forward to the attachment/detachment position, and the operation of releasing the fixing of the cover 62 by using the method described with reference to FIGS. 4 and 5 is performed (FIG. 12).

Here, when the opening/closing door 22 is opened, there is a concern about a state where the inside of the load lock chamber main body 21 communicating with a loading atmosphere of the wafer processing system 1 through the carrying-in/out hole 212 may have more particles compared to the inside of the FOUP 6. If the cover 62 is removed in this state and the pressure in the FOUP 6 is lower than the pressure in the load lock chamber main body 21, the particles enter the FOUP 6 so that the wafers W in the FOUP 6 may likely be contaminated. In order to prevent the occurrence of such a state, the load lock module 2 according to the present embodiment may perform pressure adjustment such that the pressure in the FOUP 6 is kept higher than the pressure in the load lock chamber main body 21.

As a specific method, as shown in FIG. 11, the opening/closing valve V2 in the exhaust line 502 is opened and the vacuum exhaust part 52 is operated, thereby adjusting the pressure in the load lock chamber main body 21 so that the load lock chamber main body 21 may be in a depressurized state (a pressure equal to or higher than the vacuum pressure state) which is slightly lower than the atmospheric pressure state. Alternatively, as shown in the same figure, the opening/closing valve V3 in the purge gas-supply line 503 is opened so that a purge gas is introduced into the FOUP 6, while an amount of exhaust from an exhaust line (not shown) is adjusted so that the pressure in the FOUP 6 is adjusted to be higher than that in the load lock chamber main body 21.

Either or both of these methods may be employed.

As such, when the fixing of the cover 62 is released by the attachment/detachment part 41 in the case where a difference in pressure is generated between the inside of the FOUP 6 and the inside of the load lock chamber main body 21, a force tending to return the attachment/detachment part 41 from the attachment/detachment position to the retraction position is applied.

When a driving mechanism of the driving part 42 for moving the attachment/detachment part 41 is composed of an air cylinder or the like, the attachment/detachment part 41 may be configured to be retracted on the condition that the force (pressure in the FOUP 6) for returning the attachment/detachment part 41 has a predetermined value. Further, if the driving mechanism of the driving part 42 is composed of a linear motor or the like, position control using an encoder or the like is used to suspend the driving mechanism at a position where a gap between the FOUP 6 and the cover 62 is generated to some extent, so that air flow may be formed to flow from the FOUP 6 toward the inside of the load lock chamber main body 21.

Figure 13:
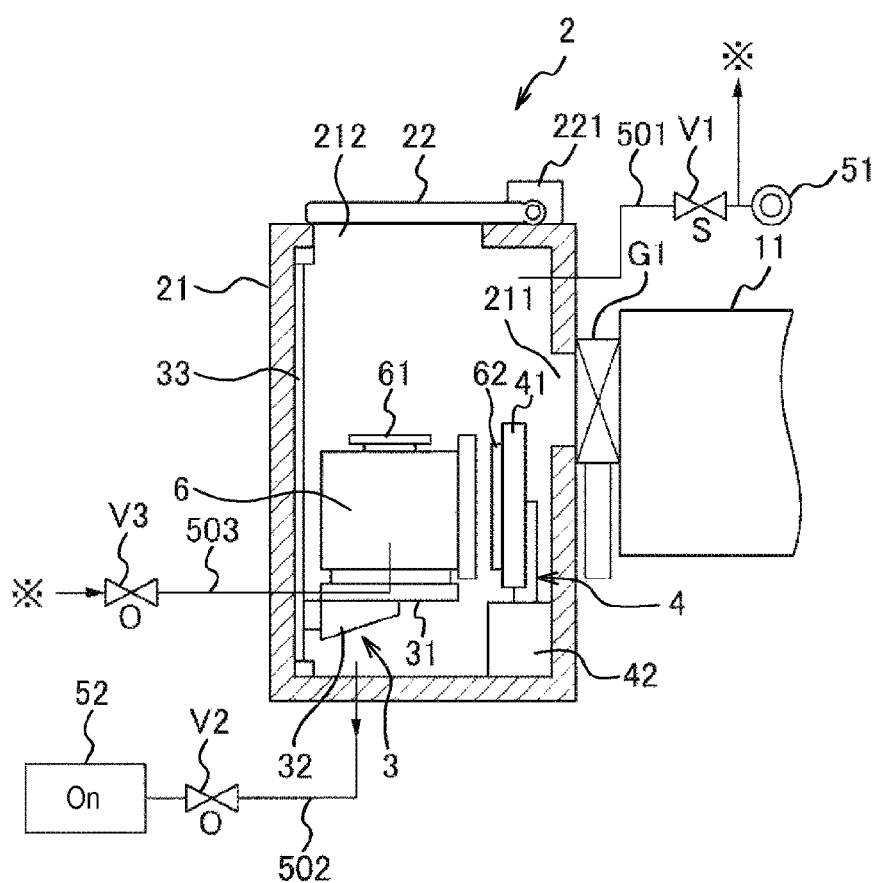
FIG. 13 is an explanatory view of a fifth operation of the load lock module.

After the pressure is adjusted as described above, the attachment/detachment part 41 is retracted to the retraction position so as to remove the cover 62 from the FOUP 6 (P3 in FIG. 8, and FIG. 13). Then, the amount of exhaust by the vacuum exhaust part 52 is increased, so that the inside (the load lock chamber) of the load lock chamber main body 21 may be vacuum-exhausted to a vacuum pressure state to be able to communicate with the vacuum transfer module 11 (P4 in FIG. 8, and FIG. 14).

Figure 14:
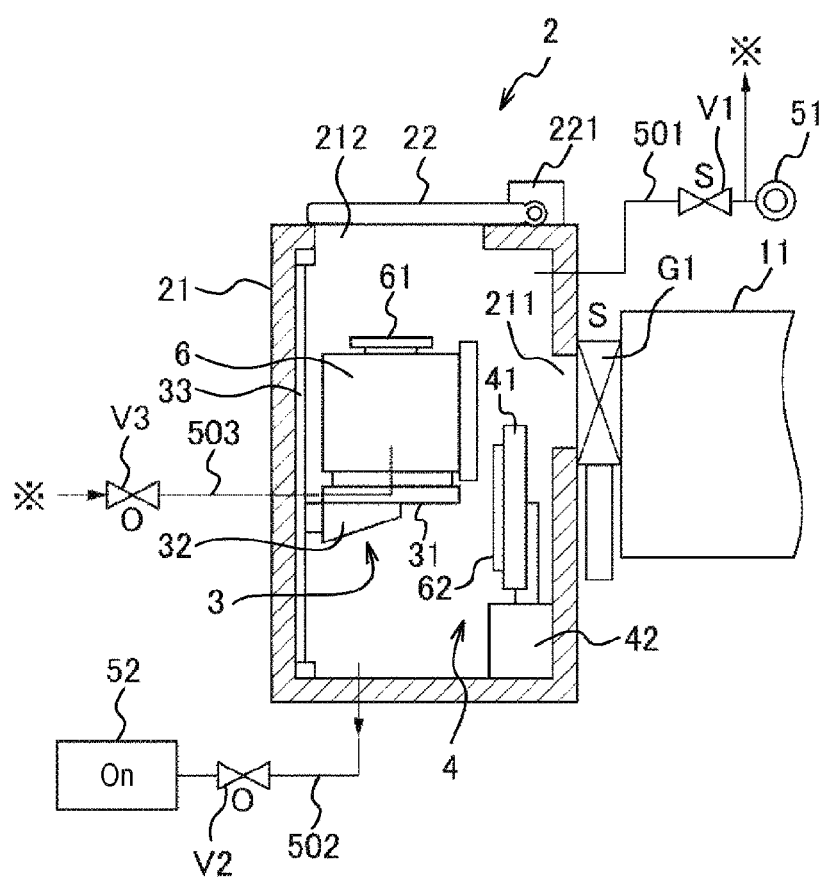
FIG. 14 is an explanatory view of a sixth operation of the load lock module.
Figure 15:
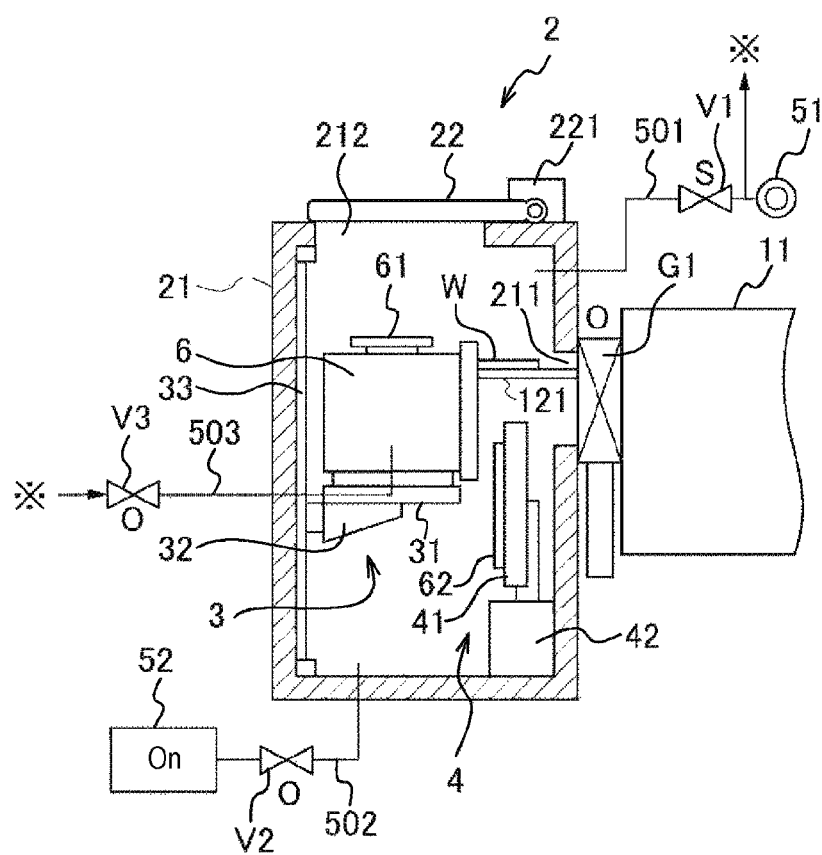
FIG. 15 is an explanatory view of a seventh operation of the load lock module.

In parallel with the vacuum exhaust of the inside of the load lock module 2, the mounting table 31 is lifted to a height position where the side surface of the FOUP 6 with the cover 62 removed therefrom is located opposite the communication hole 211. Specifically, the elevating mechanism 3 allows the FOUP 6 to be positioned at a height position where the transfer arm 121 can enter toward a slot (not show) holding a wafer W to be first taken from the FOUP 6 (FIG. 14).

When the inside of the load lock chamber main body 21 (the inside of the load lock chamber) reaches a vacuum pressure state of a predetermined pressure after the vacuum exhaust is completed, the vacuum exhaust part 52 continues the vacuum exhaust and the gate valve G1 is opened, so that the load lock module 2 and the vacuum transfer module 11 are in communication with each other. Then, the transfer arm 121 enters the load lock module 2 and is inserted into the FOUP 6 to take out the wafer W from the FOUP 6 (P5 in FIG. 8, and FIG. 15).

Figure 16:
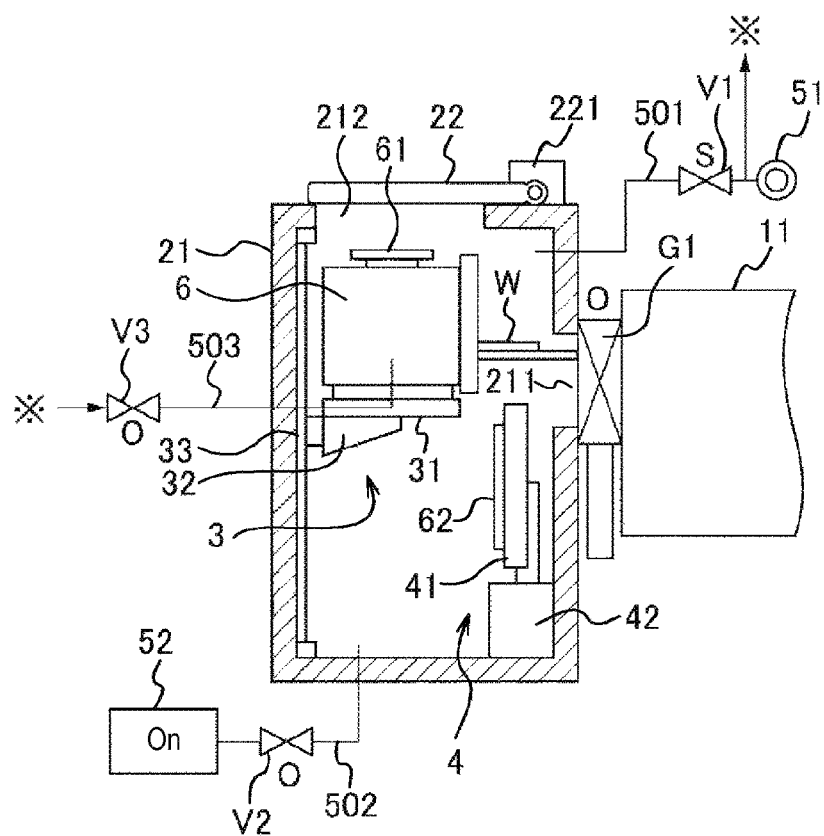
FIG. 16 is an explanatory view of an eighth operation of the load lock module.
Figure 17:
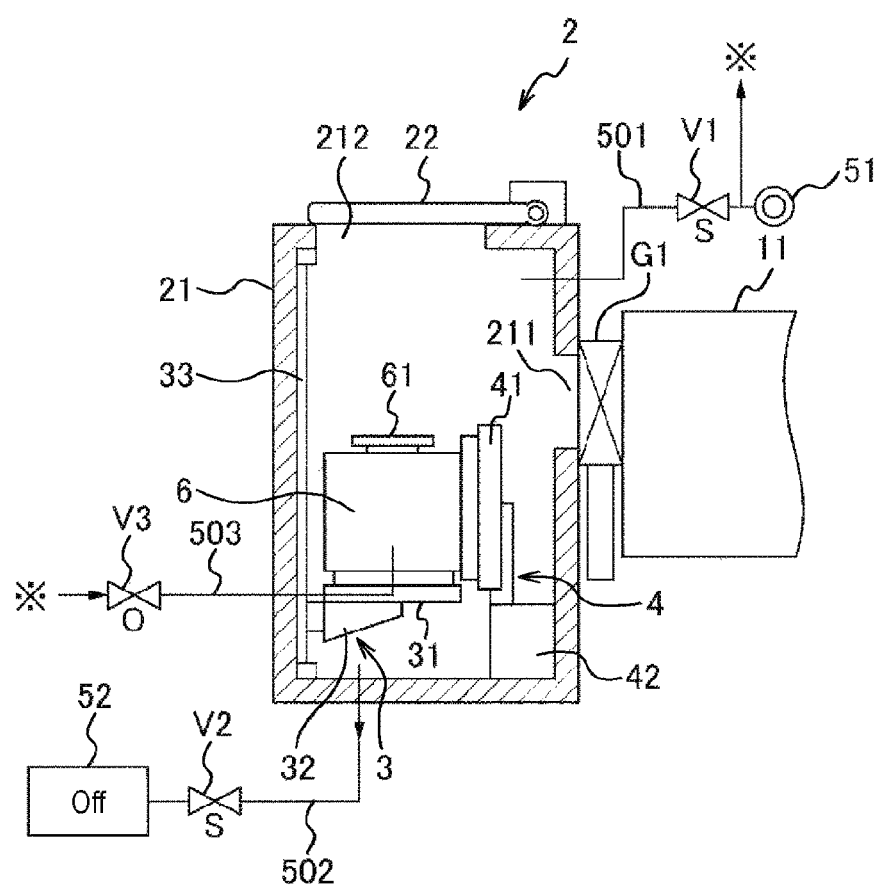
FIG. 17 is an explanatory view of a ninth operation of the load lock module.

For example, when the wafers W are taken out in a downward order from an uppermost slot formed in the shelf stage shape in the up and down direction within the FOUP 6, the elevating mechanism 3 elevates the FOUP 6 by one slot when one sheet of wafers W is taken out. The transfer arm 121 is inserted into the FOUP 6 to take out a second piece of wafer W, and the other wafers W are sequentially taken out by repeating this operation (FIG. 16).

After the wafer W taken out from the FOUP 6 is carried into the vacuum transfer module 11 and the position alignment is performed by the alignment mechanism, the wafer W is carried into the processing modules PM1 to PM4 so that predetermined processing may be performed on the wafer. The wafer W that has been processed in the processing modules PM1 to PM4 is cooled in the cooling module CM, if necessary, and then returned to the FOUP 6 that is on standby in the load lock module 2 (P5 in FIG. 8). Here, since the control part 7 remembers a relevant relationship between the respective wafers W and the slots in the FOUP 6 for holding these wafers W, the control part 7 performs control for lifting and lowering the FOUP 6 by the elevating mechanism 3 so that each of the wafers W may be returned to its corresponding slot in which the wafer W was originally held, when the wafer W subjected to the processing is returned to the FOUP 6.

In the operations taking in/out the wafers W, since the top end of the attachment/detachment part 41 (the cover attaching/detaching mechanism 4) disposed at a lower side of the communication hole 211 is placed below the entrance path (the transfer path of the wafers W) of the transfer arm 121, the load lock module 2 according to this embodiment is configured such that the attachment/detachment part 41 and the transfer arm 121 do not interfere with each other. As a result, even if a separate elevating mechanism for withdrawing the attachment/detachment part 41 from the transfer path of the wafers W is not installed, the cover 62 can be attached/detached and the wafers W can be taken in/out only by the movement of the FOUP 6 only using a common elevating mechanism 3.

Further, after the cover 62 is removed from the FOUP 6, the supply operation of the purge gas from the purge gas-supply line 503 to the FOUP 6 continues while the wafer W is taken in/out (FIGS. 13 to 16). By continuously supplying the purge gas, it is possible to prevent cross-contamination of the wafers W, which have not yet been subjected to the processing, due to the gas generated from the wafers W which have been subjected to the processing.

When the cover 62 is removed from the FOUP 6, the FOUP 6 is in communication with the inside of the load lock chamber main body 21 that is in a vacuum pressure state. Consequently, as compared to performing the take-in/out operation of the wafers W under the atmospheric pressure state, there may be a case where the generation of the gas (vacuum sublimation) from the wafers W that have been subjected to the processing easily occurs from a relationship of saturation vapor pressure of a process gas used for the processing or a film formed on the wafer W. In a state where the cover 62 has been removed from the FOUP 6, the continuous supply of the purge gas into the FOUP 6 is effective to take-in/out the wafers W on the condition that the gas may be easily generated as such.

Figure 18:
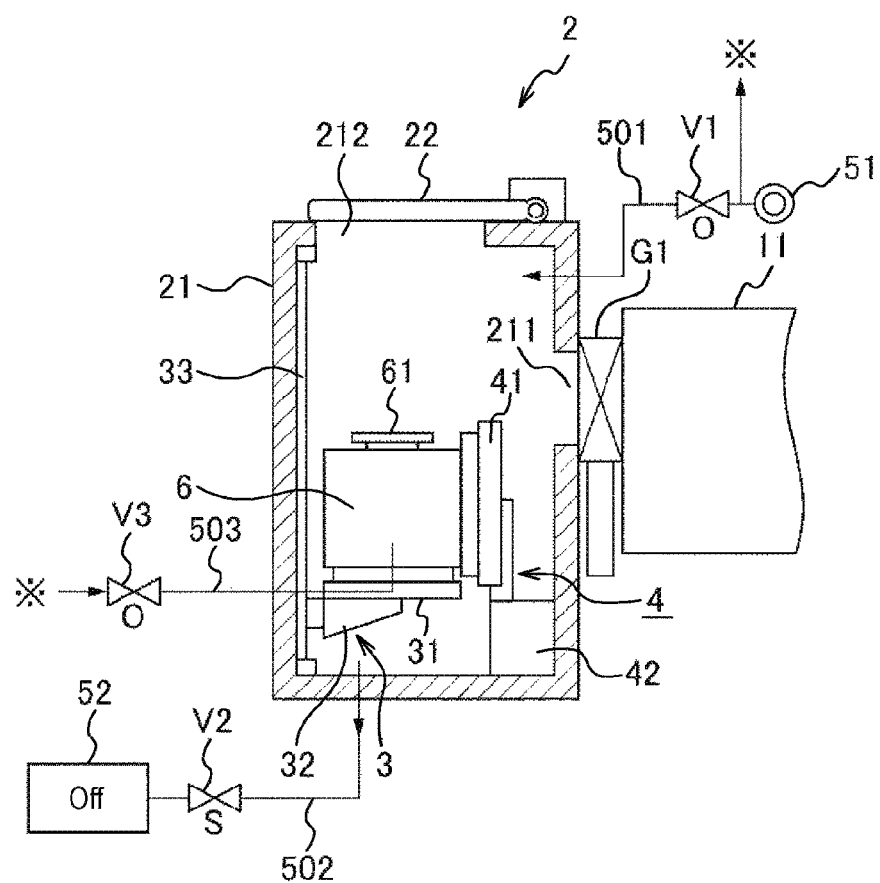
FIG. 18 is an explanatory view of a tenth operation of the load lock module.

When the processing for all the wafers W are completed and all the wafers W are returned to the FOUP 6, the gate valve G1 is closed and the FOUP 6 is lowered to the height position that is opposite to the attachment/detachment part 41 while continuously supplying the purge gas. Then, the attachment/detachment part 41 is moved to the attachment/detachment position, and the cover 62 is installed at the FOUP 6 (P6 in FIG. 8, and FIG. 17). Then, the vacuum exhaust is suspended and nitrogen gas is introduced from the nitrogen supply line 501 into the load lock chamber main body 21, so that the pressure in the load lock chamber main body 21 becomes an atmospheric pressure state (FIG. 18).

Further, when the cover 62 is closed, the supply of the purge gas into the FOUP 6 continues. At this time, the amount of exhaust from the exhaust line (not shown) may be adjusted to keep the pressure in the FOUP 6 at a pressure higher than that in the load lock chamber main body 21. Further, the amount of supply of nitrogen gas into these spaces may be adjusted to keep the pressure in the FOUP 6 at a pressure higher than that in the load lock chamber main body 21. Then, when the inside of the load lock chamber main body 21 becomes the atmospheric pressure state and the pressure in the FOUP 6 becomes a pressure state that is slightly higher than atmospheric pressure (a pressure state allowing an excessive stress not be applied to the FOUP 6), the introduction of the purge gas into the load lock chamber main body 21 is suspended (P7 in FIG. 8). The introduction of nitrogen gas from the purge gas supply line 503 into the FOUP 6 may be simultaneously suspended together with the suspension of the introduction of the purge gas into the load lock chamber main body 21. Alternatively, the introduction of nitrogen gas may be suspended before the introduction of the purge gas into the load lock chamber main body 21 is suspended or after the FOUP 6 is taken out.

As a result of such manipulation, the inside of the FOUP 6 is filled with nitrogen gas and the concentration of water molecules or oxygen molecules around the wafers W is lowered.

Herein, nitrogen gas is supplied into the FOUP 6 of the vacuum pressure state, thereby effectively filling nitrogen gas as compared to, for example, a case of adjusting the pressure of the load lock chamber main body 21 to the atmospheric pressure state using air, closing the cover 62, and then substituting is closed so that the interior atmosphere of the FOUP 6 is substituted with a nitrogen gas atmosphere.

When the inside of the FOUP 6 and the inside of the load lock chamber main body 21 become predetermined pressure states, the opening/closing door 22 is opened so that the carrying-in/out hole 212 is in an opened state. Then, when the FOUP 6 is lifted to a delivery position of the OHT, the flange part 61 of the FOUP 6 is held and lifted by the holding part 8 of the OHT, thereby completing the carry-out operation (P8 in FIG. 8). Further, in order to prevent nitrogen gas from leaking from the load lock module 2 when the opening/closing door 22 is opened, the interior atmosphere of the load lock module 2 may be substituted with air after the cover 62 is installed to the FOUP 6. Further, an air curtain may be formed at the carrying-in/out hole 212 to isolate the nitrogen gas atmosphere in the load lock module 2 from the ambient atmosphere (air).

With the load lock module 2 according to the embodiment, there are effects described below. Since the cover attaching/detaching mechanism 4 for implementing the attachment/detachment of the cover 62 to/from the FOUP 6 and the communication hole 211 into the vacuum transfer module 11 through which the wafers W from the FOUP 6 are taken-in/out are arranged vertically, the FOUP 6 can be moved to the height position opposite to the cover attaching/detaching mechanism 4 and the height position opposite to the communication hole 211 only by lifting and lowering the FOUP 6 using the common elevating mechanism 3.

As a result, even if an operation of withdrawing the cover attaching/detaching mechanism 4 from the communication hole 211 by a separate elevating mechanism installed at the cover attaching/detaching mechanism 4 is not performed, it is possible to perform the attachment/detachment operation of the cover 62 and the take-in/out operation of the wafers W to/from the FOUP 6 only by using the elevating mechanism 3.

Further, since the carrying-in/out hole 212 is formed in the ceiling surface of the load lock module 2, it is possible to perform the carrying-in/out operation of the FOUP 6 with respect to the load lock module 2, in addition to the attachment/detachment operation of the cover 62 and the take-in/out operation of the wafers W, using the lifting and lowering operations of the FOUP 6 by the elevating mechanism 3.

However, the carrying-in/out of the FOUP 6 is not limited to the case where the carrying-in/out of the FOUP 6 is performed through the carrying-in/out hole 212 formed in the ceiling surface of the load lock module 2. For example, as for the right and left load lock modules 2 shown in FIG. 1, carrying-in/out holes 212 may be also formed in right and left sidewall surfaces thereof, respectively, so that the right and left load lock modules 2 may receive the FOUP 6 carried by a transfer mechanism such as an automated guided vehicle (AGV) which moves on a floor of a factory. Further, in FIG. 1, the sidewall surface of each of the load lock modules 2 where the elevating mechanism 3 is installed may be configured to be rotated about a vertically extending rotation axis as well as to be withdrawn in the forward and backward directions, thereby enabling the FOUP 6 carried from the front side of the load lock module 2 to be loaded on the mounting table 31.

Figure 19:
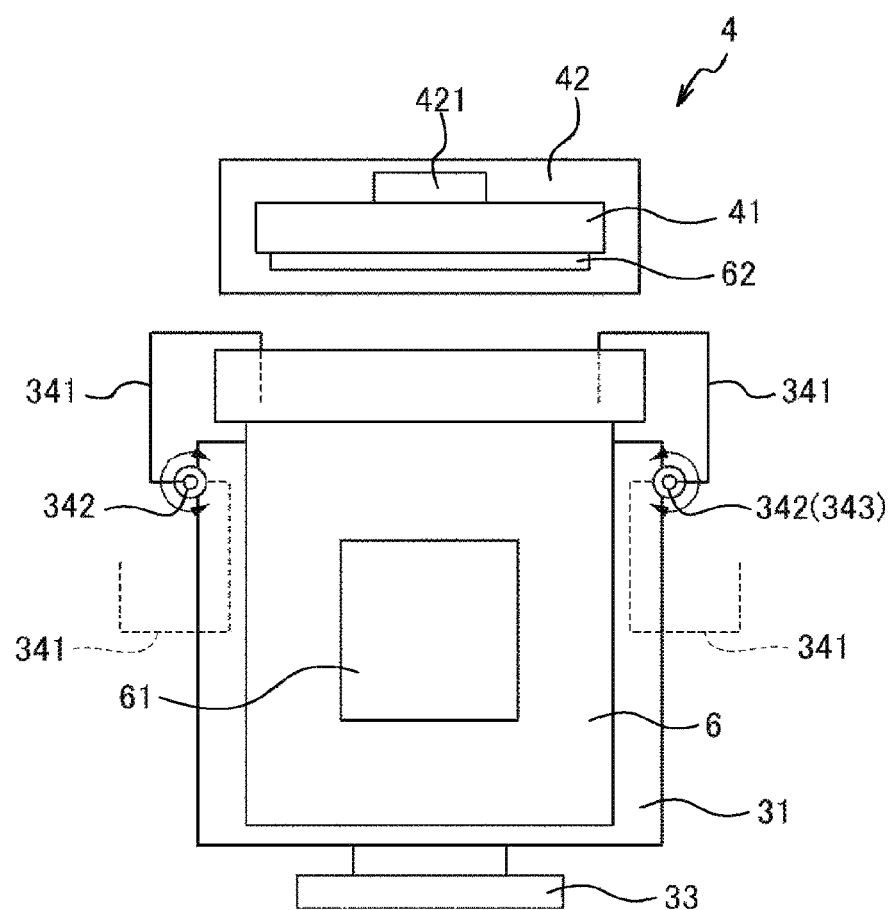
FIG. 19 is a plan view illustrating another embodiment of a purge gas-supplying part of the FOUP.
Figure 20:
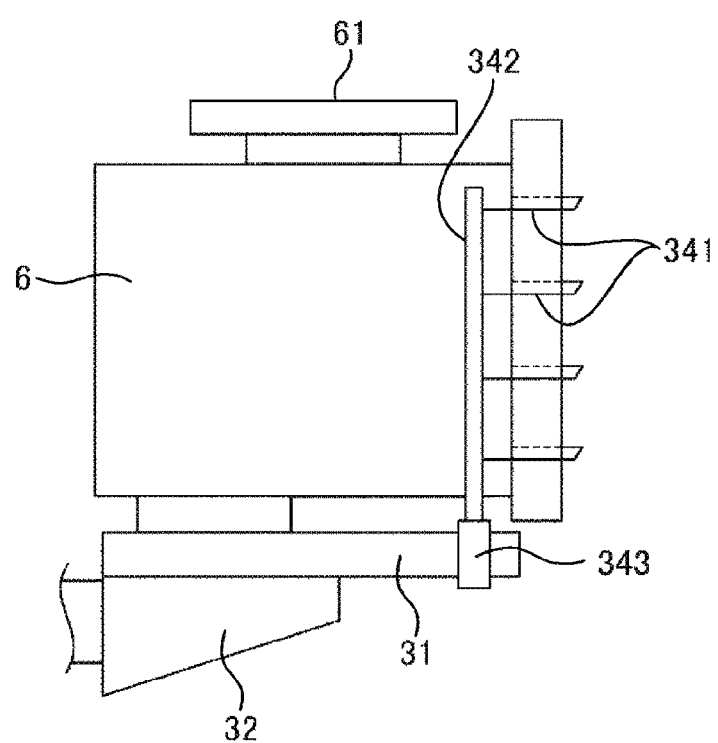
FIG. 20 is a side view of the purge gas-supplying part in the other embodiment.

FIGS. 19 and 20 show an example of a purge gas supply part (an inert gas supply part) for supplying nitrogen gas served as a purge gas into the FOUP 6 through the opening of the FOUP 6 by inserting nozzles 341 to the opening after the cover 62 is removed. As shown in FIG. 20, purge gas supply pipes 342 are installed to extend in the vertical direction on the right and left side surfaces of the mounting table 31, respectively, and the plurality of nozzles 341 are installed at an interval in a height direction of each of the purge gas supply pipes 342. Rotation drive parts 343 for rotating the purge gas supply pipes 342 about their vertical axes are installed at base ends of the purge gas supply pipes 342.

As shown in FIG. 19, a plan view of the nozzle 341 shows a hook-like bent shape with a base end served by the purge gas supply pipe 342. By rotating the purge gas supply pipe 342 about its vertical axis, the purge gas supplying part having such a configuration may be moved between a state where front ends of the nozzles 341 are inserted into the opening of the FOUP 6 with the cover 62 removed therefrom in supplying the purge gas and a state where the nozzles 341 are withdrawn from the opening in installing the cover 62.

Further, the disposition position of the cover attaching/detaching mechanism 4 is not limited to the case where the cover attaching/detaching mechanism 4 is disposed at the lower side of the communication hole 211 as shown in FIG. 2 and the like. For example, the cover attaching/detaching mechanism 4 may be reversed up and down and then configured to dangle from the ceiling surface of the load lock chamber main body 21, so that the cover attaching/detaching mechanism 4 (the attachment/detachment part 41) may be disposed at an upper side of the communication hole 211.

Since the cover attaching/detaching mechanism for implementing the attachment/detachment of the cover to/from the substrate container and the communication hole into the vacuum transfer chamber through which the substrates from the substrate container are taken-in/out are arranged vertically, the substrate container can be moved between the height position opposite the cover attaching/detaching mechanism and the height position opposite the communication opening only by lifting and lowering the substrate container using a common elevating mechanism.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A load lock apparatus having a load lock chamber connected to a vacuum transfer chamber configured to transfer a substrate under a vacuum pressure state via a communication hole which is opened and closed by a gate valve, and configured to be capable of switching an inner pressure into an atmospheric pressure state and the vacuum pressure state, the load lock apparatus comprising:
   a load lock chamber main body having a carrying-in/out hole through which a substrate container, which is configured to accommodate a plurality of substrates and has an attachable/detachable cover installed on a side surface of the substrate container, can be carried in/out, and an opening/closing door configured to open and close the carrying-in/out hole, wherein the communication hole is formed in a side surface of the load lock chamber;
   a cover attaching/detaching mechanism installed at a height position which is a lower side of the communication hole in the load lock chamber, and configured to be horizontally advanced and retracted between an attachment/detachment position at which the cover is attached/detached to/from the substrate container and a retraction position at which the cover is retracted from the attachment/detachment position; and
   an elevating mechanism installed in the load lock chamber and including a mounting table on which the substrate container is loaded, the elevating mechanism being configured to lift and lower the mounting table such that the cover-installed side surface of the substrate container loaded on the mounting table can be moved between a height position opposite to the communication hole and a height position opposite to the cover attaching/detaching mechanism.

2. The load lock apparatus of claim 1, wherein the carrying-in/out hole is installed in a ceiling surface of the load lock chamber main body, and the elevating mechanism is configured to lift the mounting table up to a height position at which the substrate container can be carried in/out through the carrying-in/out hole.

3. The load lock apparatus of claim 1, further comprising a vacuum exhaust part configured to vacuum-exhaust the inside of the load lock chamber,
   wherein the inside of the load lock chamber is vacuum-exhausted by the vacuum exhaust part such that an inside of the load lock chamber becomes a pressure state lower than the atmospheric pressure state and equal to or higher the vacuum pressure state, so as to keep the pressure in the substrate container at a pressure higher than that in the load lock chamber until the cover of the substrate container is removed by the cover attaching/detaching mechanism after the substrate container is carried into the load lock chamber.

4. The load lock apparatus of claim 1, further comprising an inert gas supply part configured to supply an inert gas into the substrate container,
   wherein the inert gas is supplied from the inert gas supply part into the substrate container so as to keep the pressure in the substrate container at a pressure higher than that in the load lock chamber until the cover of the substrate container is removed by the cover attaching/detaching mechanism after the substrate container is carried into the load lock chamber.

5. The load lock apparatus of claim 1, further comprising an inert gas supply part configured to supply an inert gas into the substrate container,
    wherein the inert gas is supplied from the inert gas supply part into the substrate container during a period that the cover of the substrate container is removed by the cover attaching/detaching mechanism.

6. The load lock apparatus of claim 1, further comprising:
    a first inert gas supply part configured to supply an inert gas into the substrate container;
    a pressure switching mechanism including a second inert gas supply part configured to supply an inert gas into the load lock chamber, and configured to switch the pressure in the load lock chamber; and
    a control part configured to output control signals to perform:
        after the substrate is taken in/out with respect to the substrate container with the cover removed therefrom within the load lock chamber in the vacuum pressure state, closing the gate valve and isolating the load lock chamber from the vacuum transfer chamber;
        installing the cover at the substrate container by the cover attaching/detaching mechanism while continuously supplying the inert gas from the first inert gas supply part into the substrate container;
        after the cover is installed at the substrate container, switching the pressure in the load lock chamber to the atmospheric pressure state by supplying the inert gas from the second inert gas supply part; and
        after the pressure in the load lock chamber is switched to the atmospheric pressure, suspending the supply of the inert gas from the second inert gas supply part, opening the opening/closing door of the carrying-in/out hole, and carrying out the substrate container with the cover installed thereon.

7. The load lock apparatus of claim 6, wherein the control part is further configured to output control signals the load lock apparatus to adjust amounts of supply of the inert gas from the first and second inert gas supply parts and to keep the pressure in the substrate container at a pressure higher than that in the load lock chamber while performing switching the pressure in the load lock chamber to the atmospheric pressure state.

8. The load lock apparatus of claim 1, wherein the cover attaching/detaching mechanism has a latch key configured to be connected to the cover of the substrate container, and the cover is held by the latch key.

9. A substrate processing system, comprising:
    the load lock apparatus of claim 1;
    a vacuum transfer chamber connected to the load lock chamber through the communication hole and provided with a substrate transfer mechanism configured to transfer the substrate; and
    a substrate processing chamber connected to the vacuum transfer chamber and configured to perform processing on the substrate transferred by the substrate transfer mechanism.

10. The system of claim 9, further comprising a cooling chamber connected to the vacuum transfer chamber and configured to cool the substrate before the substrate processed in the substrate processing chamber is returned to the substrate container in the load lock chamber.

* * * * *